United States Patent
Xu

(10) Patent No.: US 9,978,631 B2
(45) Date of Patent: May 22, 2018

(54) WAFER PICK-AND-PLACE METHOD AND SYSTEM

(71) Applicant: BEIJING NAURA MICROELECTRONICS EQUIPMENT CO., LTD., Beijing (CN)

(72) Inventor: Dong Xu, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 106 days.

(21) Appl. No.: 15/281,101

(22) Filed: Sep. 30, 2016

(65) Prior Publication Data

US 2017/0194187 A1 Jul. 6, 2017

(30) Foreign Application Priority Data

Dec. 31, 2015 (CN) .......................... 2015 1 1021420
Dec. 31, 2015 (CN) .......................... 2015 1 1021438
Dec. 31, 2015 (CN) .......................... 2015 1 1023511
Dec. 31, 2015 (CN) .......................... 2015 1 1026648

(51) Int. Cl.
*H01L 21/687* (2006.01)
*H01L 21/67* (2006.01)

(52) U.S. Cl.
CPC .. *H01L 21/68707* (2013.01); *H01L 21/67265* (2013.01)

(58) Field of Classification Search
CPC ......... H01L 21/68707; H01L 21/67265; H01L 2924/0002; H01L 2924/00; H01L 21/681; H01L 21/6838; H01L 21/67259; H01L 21/68; H01L 22/12; H01L 21/67748; H01L 21/67775; H01L 21/67092; H01L 21/67225; H01L 21/67778; H01L 2223/5442; H01L 2223/54426; H01L 2223/54453; H01L 2223/54493; H01L 23/544; H01L 21/6732; H01L 21/67766
USPC .................................................. 700/245, 253
See application file for complete search history.

(56) References Cited

U.S. PATENT DOCUMENTS

| | | | | |
|---|---|---|---|---|
| 6,275,748 | B1 * | 8/2001 | Bacchi | H01L 21/68707 414/941 |
| 7,039,498 | B2 * | 5/2006 | Bacchi | B25J 9/1692 414/744.3 |
| 8,781,787 | B2 * | 7/2014 | Hayashi | H01L 21/681 702/150 |
| 9,076,829 | B2 * | 7/2015 | Brodine | H01L 21/67742 |
| 2002/0042666 | A1 * | 4/2002 | Bacchi | H01L 21/6838 700/275 |

(Continued)

*Primary Examiner* — Jaime Figueroa
(74) *Attorney, Agent, or Firm* — Tianchen LLC

(57) ABSTRACT

A wafer pick-and-place method and system is provided. During the wafer pick-and-place operation, the distance between the fork of the robot and the target wafer is detected to determine whether the robot will collide with the target wafer. Furthermore, the tilted angle of the target wafer relative to the fork is calculated to determine whether the wafer will slip off. If collision or wafer slippery may occur, the pick-and-place operation is stopped. Therefore, wafer damages due to unexpected contact between the fork and the wafer can be avoided, and wafer handling safety can be improved.

20 Claims, 9 Drawing Sheets

(56) References Cited

U.S. PATENT DOCUMENTS

| | | | |
|---|---|---|---|
| 2003/0202865 A1* | 10/2003 | Ponnekanti | H01L 21/67742 414/217 |
| 2005/0021177 A1* | 1/2005 | Bacchi | B25J 9/1692 700/245 |
| 2007/0285673 A1* | 12/2007 | Kiley | B65G 25/02 356/614 |
| 2008/0232937 A1* | 9/2008 | Abe | H01L 21/67265 414/222.02 |
| 2010/0297562 A1* | 11/2010 | Shibazaki | G03F 7/70691 430/325 |
| 2011/0135437 A1* | 6/2011 | Takeshita | B25J 9/042 414/744.5 |
| 2013/0028687 A1* | 1/2013 | Takahashi | H01L 21/67757 414/160 |
| 2013/0177857 A1* | 7/2013 | Shibazaki | G03F 7/70133 430/325 |
| 2015/0131088 A1* | 5/2015 | Shinohara | H01L 21/67781 356/237.5 |
| 2015/0340258 A1* | 11/2015 | Hiyashi | H01L 21/67288 414/416.03 |

* cited by examiner

--Prior Art--

WAFER PICK-AND-PLACE METHOD AND SYSTEM

CROSS-REFERENCE TO RELATED APPLICATION

The application is related to and claims the priority benefit of Chinese Patent Application Serial No. 201511023511.6, filed Dec. 31, 2015, Chinese Patent Application Serial No. 201511021420.9, filed Dec. 31, 2015, Chinese Patent Application Serial No. 201511021438.9, filed Dec. 31, 2015, and Chinese Patent Application Serial No. 201511026648.7, filed Dec. 31, 2015; the entirety of each of the above-mentioned patent applications is hereby incorporated by reference herein and made a part of the specification.

FIELD OF THE INVENTION

The present invention generally relates to the field of semiconductor manufacturing equipment, more particularly, to a wafer pick-and-place method and system.

BACKGROUND OF THE INVENTION

Safe wafer pick-and-place is a very important technical indicator for integrated circuit production lines. Generally, the breakage rate of wafers due to wafer handling equipment in the course of production should be less than 0.001%. Compared with a single-wafer processing system, a batch-type wafer heat treatment system requires more wafer transfer and pick-and-place operations in each production process, which makes higher demands of safe and reliable wafer transfer and pick-and-place.

Nowadays, robots have been widely applied in the field of semiconductor IC manufacturing technology and have become important tools in wafer handling systems for picking, placing and transferring unprocessed and processed wafers. The robot can response to instructions to accurate move to a point of wafer location in a three-dimensional or two-dimensional space to pick and place wafers.

Currently, the positional parameters of the robot during handling a wafer in the batch-type wafer heat treatment equipment are generally obtained by offline teaching. The offline teaching data of the positional parameters are usually stored in a memory and calibrated periodically. The robot performs the pick-and-place operation to the wafers located in a wafer carrier according to the stored offline teaching data. However, factors such as environment temperature variation, load variation, and mechanical deformation of the wafer carrier may cause collision of the robot with the wafer or the wafer carrier when the robot performs the pick-and-place operation to the wafer at a stored position on the offline basis, resulting in irreparable losses such as damages to the wafer or equipment. In addition, thermal deformation of the wafer during the heat treatment may also cause an offset between an actual location of the wafer and the robot positional parameter of the offline teaching data, which puts the robot pick-and-place operation in an unsafe condition.

FIG. 1 is a structural view illustrating the positions of the robot in the conventional wafer transfer and pick—and place process. If a wafer 2 positioned on a supporter 3 is in an abnormal condition such as in an inclined state, the robot 1 may perform the pick-and-place operation to the wafer 2 under an unsafe condition, and damages to the wafer 2 and the equipment (including the robot 1) can be easily occurred.

Accordingly, after the place operation or before the pick-up operation, an accurate pose recognition for the wafers 2 on the supporter 3 is required, such that proper measures can be taken to the wafers in the abnormal condition to ensure a safe pick-and-place operation.

BRIEF SUMMARY OF THE DISCLOSURE

In order to overcome the drawbacks mentioned above, the present invention provides a wafer pick-and-place method during which pose recognition to a target wafer on a wafer carrier is performed. The present invention also provides a wafer pick-and-place system, which can fast and accurate detect the state of the target wafer on the wafer carrier, recognize the tilted pose of the target wafer, and ensure a safe wafer pick-and-place operation.

According to one aspect of the present invention, a wafer pick-and-place method is provided for picking and placing a target wafer in a wafer carrier. The method comprises the following steps:

Step S1: providing a robot having a fork, wherein the fork has a first sensor group of at least three non-linear arranged upper sensors fixed on its top surface;

Step S2: actuating the robot in accordance with offline teaching data including a sequence of waypoints which define a pick-up operation path or a place operation path for the robot corresponding to the target wafer;

Step S3: periodically detecting distances between the fork and the target wafer by the upper sensors when the robot moves below the wafer carrier and calculating a tilted angle of the target wafer according to the distances detected by the upper sensors each time;

Step S4: determining whether at least one distance detected by the upper sensors exceeds a preset range and whether the tilted angle exceeds a limit angle; if either the distance exceeds the preset range or the tilted angle exceeds the limit angle, stopping the robot.

According to another aspect of the present invention, a wafer pick-and-place system for picking and placing a target wafer in a wafer carrier is provided. The system comprises a robot having a fork, a store module storing offline teaching data which includes a sequence of waypoints defining a pick-up operation path or a place operation path for the robot corresponding to the target wafer, a first sensor group of at least three non-linear arranged upper sensors fixed on a top surface of the fork for periodically detecting distances between the fork and the target wafer when the robot moves below the target wafer, a calculate module calculating a tilted angle of the target wafer according to the distances detected by the upper sensors each time, a determined module determining whether at least one distance detected by the upper sensors exceeds a preset range and whether the tilted angle exceeds a limit angle; and a control module stopping the robot if either the distance exceeds the preset range or the tilted angle exceeds the limit angle.

According to the present invention, during the pick-and-place operation of the robot, the distance between the fork of the robot and the target wafer is detected to determine whether the robot will collide with the target wafer. Furthermore, the tilted angle of the target wafer relative to the fork is calculated to determine whether the wafer will slip off. If collision or wafer slippery may occur, the pick-and-place operation is stopped. Therefore, wafer damages due to unexpected contact between the fork and the wafer can be avoided, and wafer handling safety can be improved.

DETAILED DESCRIPTION OF THE EMBODIMENTS

Reference will now be made in detail to the present preferred embodiments to provide a further understanding of the invention. The specific embodiments and the accompanying drawings discussed are merely illustrative of specific ways to make and use the invention, and do not limit the scope of the invention or the appended claims.

Figure 1:
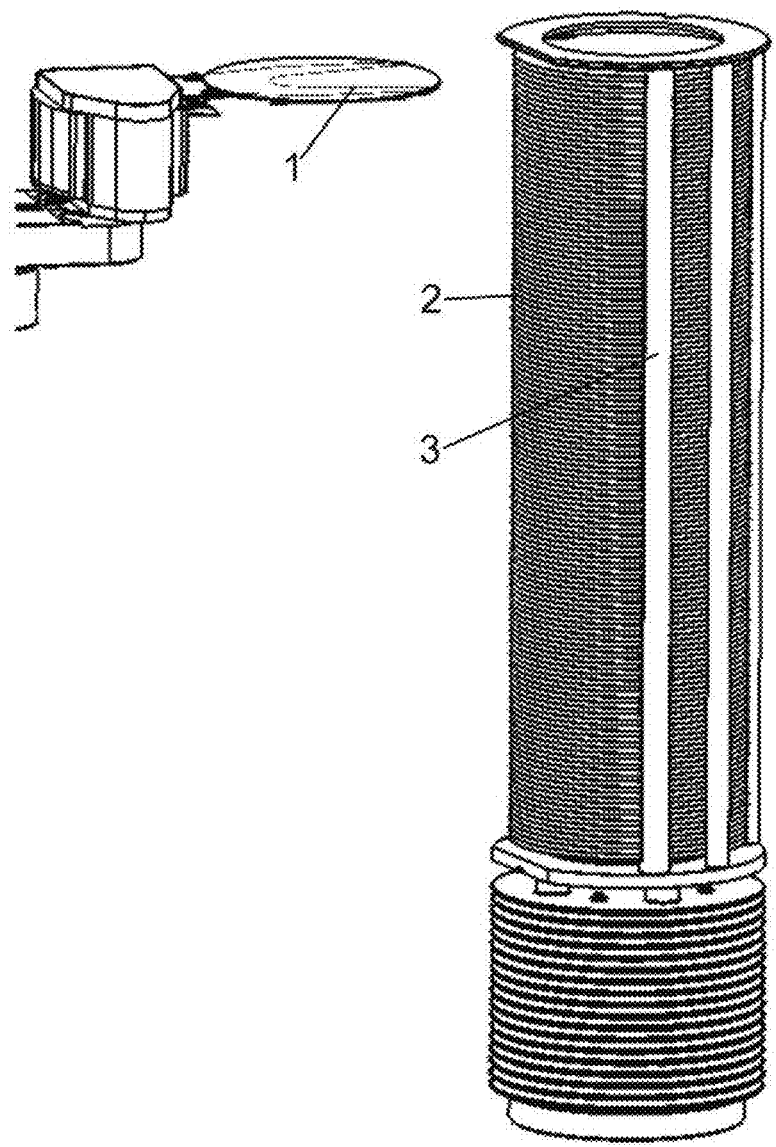
FIG. 1 is a view illustrating positions of the robot during wafer transfer and pick-and-place process in the prior art.
Figure 2:
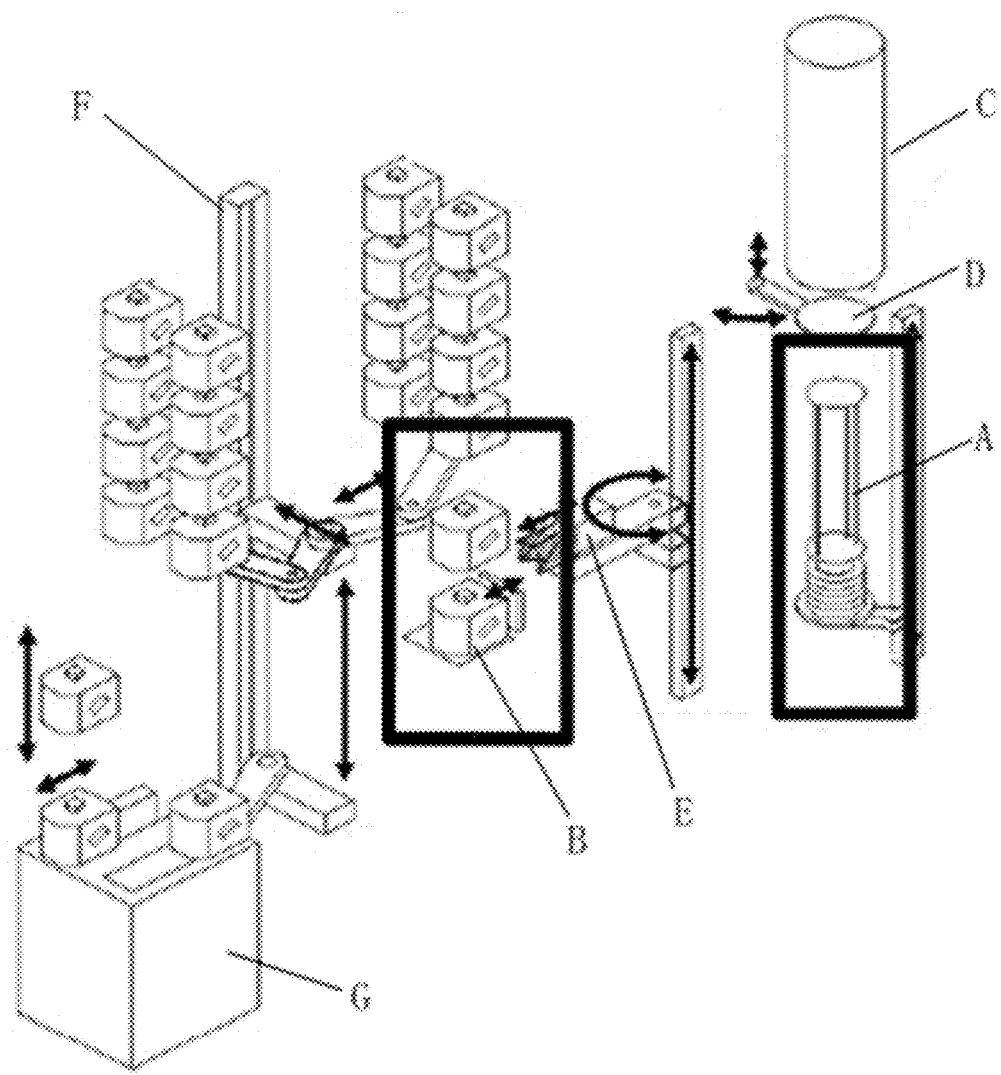
FIG. 2 is a structural view of wafer carriers in the semiconductor equipment according to an embodiment of the present invention.

The semiconductor equipment of the present invention includes a wafer carrier supporting multiple wafers and a robot which performs the wafer pick-and-up operation. The wafer carrier has supporters on which the wafers are horizontally positioned in a vertical stack. As shown in FIG. 2, in a preferred embodiment of the present invention, the wafer carrier can be a front-opening unified pod (FOUP) B which stores the wafers or it can be a wafer boat A which loads the wafers into a reaction chamber C. The semiconductor equipment further has a FOUP holder F for holding the FOUPs B, which is connected to a pedestal G. During wafer handling, the robot E picks up the wafers from the FOUP B and places them on the wafer boat A. After the wafers being loaded into the wafer boat, a furnace door D at the bottom of the reaction chamber C is opened and the wafer boat A carrying the wafers is ascended into the reaction chamber C. When the reaction is completed, the furnace door D is opened, the wafer boat A carrying the processed wafer is descended from the bottom of the reaction chamber C, and then the robot E picks up the wafers from the wafer boat A and places them into the FOUP B. Wherein, the movement directions of the components A, B, D, E mentioned above are indicated by arrows as shown in FIG. 2. Therefore, as for the wafer pick-up operation of the present invention, the wafers are taken out from either the FOUP or the wafer boat. Similarly, as for the wafer place operation, the wafers are placed into either the FOUP or the wafer boat.

The wafer pick-and-place method and system according to the present invention will be described in details hereinafter in conjunction with FIGS. 3-11 and embodiments. The figures referred to above are in simplified forms and not necessarily drawn to scale, should be understood to provide a representation of particular embodiments of the invention, and are merely conceptual in nature and illustrative of the principle involved.

First Embodiment

Figure 3:
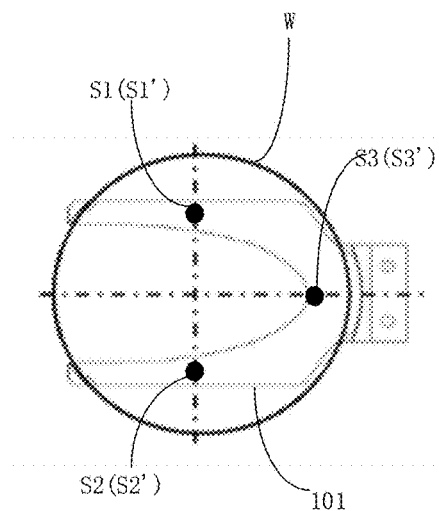
FIG. 3 is a view illustrating the position relationship between the fork of the robot and the target wafer on the fork according to a first embodiment of the present invention.
Figure 4:
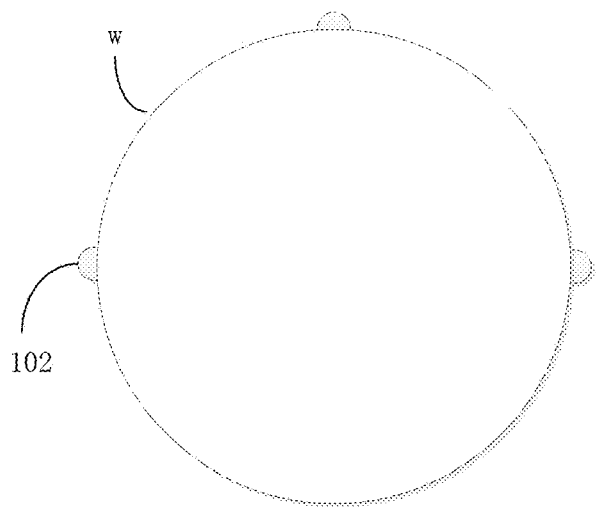
FIG. 4 is a top view illustrating the position relationship between the first sensor group, the fork, the target wafer and the supporters of the wafer carrier according to the first embodiment of the present invention.
Figure 4:
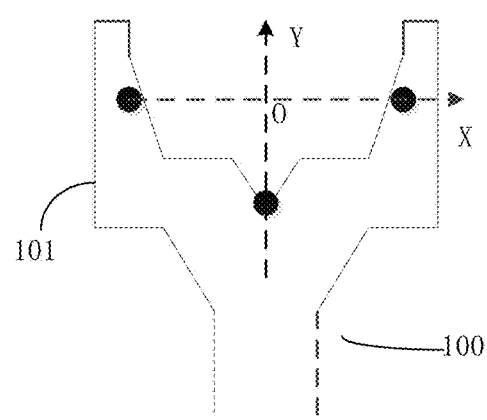

Referring to FIG. 3 and FIG. 4, in the embodiment, the wafer carrier is a wafer boat including a plurality of (for example, three) supporting columns which are separated from and in parallel to each other in the semi-circumference of the wafer W, and supporters 102 arranged on each of the columns at a predetermined vertical interval and extending inward for holding edge portions of the wafers from below.

In the embodiment, the wafer pick-and-place system comprises a robot 100 having a fork, a first sensor group having at least three non-linear arranged upper sensors fixed on the top surface of the fork, a store module, a determine module, a calculate module, a control module and optionally an alert module.

In the field of semiconductor technology, the conventional robot may have a single arm or multiple arms to achieve mass production. In some embodiments of the present invention, the robot can be a multiple arm robot with more than one arm each having a fork provided with the first sensor group on the top surface. In the embodiment, a single arm robot having only one fork with the first sensor group fixed on its top surface is taken as an example.

Figure 5A:
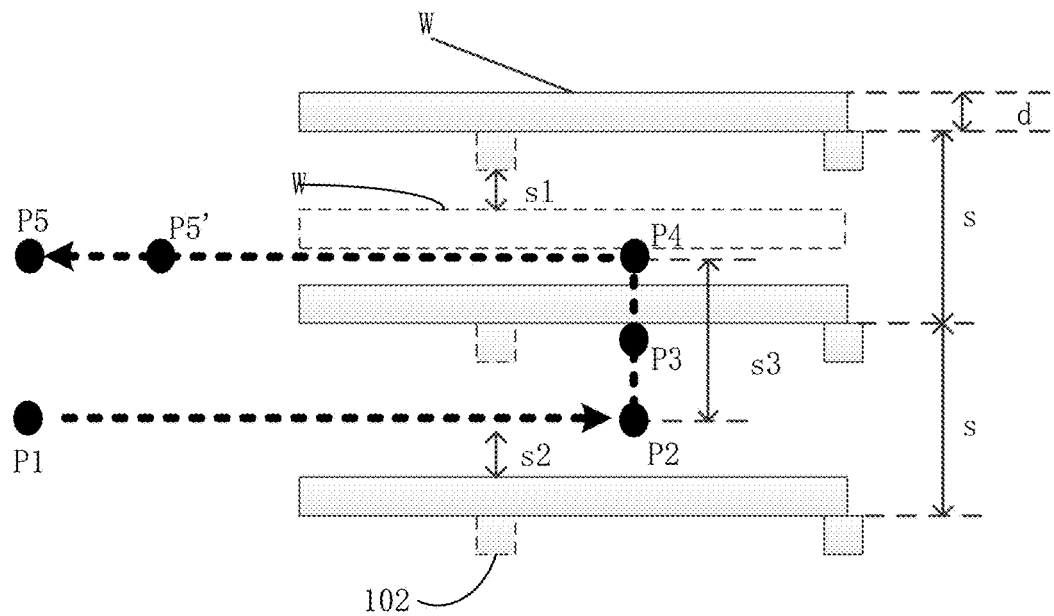
FIG. 5a is a view illustrating a wafer pick-up path and the position relationship between the wafer, the supporters and the fork according to the first embodiment of the present invention.

The fork is a V-shaped fork whose symmetrical axis coincides with a bisector of the wafer W. The largest distance between outer surfaces of two wings of the V-shaped fork is less than a diameter of the wafer W. The fork can also have a gripper for clamping the wafer more stably. During the wafer pick-and-place operation, the robot is programmed and activated in accordance with offline teaching data The store module stores the offline teaching data which teaches the motion of the robot. The offline teaching data includes a sequence of waypoints which define an operation path for the robot corresponding to the target wafer. FIG. 5a is a view illustrating the positional relation between the target wafer, the supporter and the fork during the pick-up operation. Herein, the term "target wafer" refers to a wafer to be picked-up or to be placed by the robot. According to the embodiment, the robot performs the wafer pick-up operation along a pick-up operation path as represented by the thick dotted line of FIG. 5a passing through five waypoints P1-P5 successively. Wherein, the waypoint P1 represents a first position at which the robot is ready to enter into the wafer carrier, the waypoint P2 represents a second position right below the target wafer at which the robot is ready to touch the target wafer. The waypoints P1 and P2 are in the same level at a height of "S2" relative to the plane of an underlying wafer, the distance between the waypoint P1 and the wafer carrier is preferably to be greater than twice the vertical interval "S" between the supporters. The waypoint P3 represents a third position at which the robot touches the target wafer and picks it up from the wafer carrier, the waypoint P4 represents a fourth position right above the third position P3 at which the robot holds the target wafer and is ready to leave the wafer carrier, the waypoint P5 represents a fifth position outside the wafer carrier at which the robot finishes the pick-up operation. The distance between the waypoint P5 and the wafer carrier is preferably to be greater than twice the vertical interval "S" between the supporters. The waypoints P4 and P5 are in the same level at a height of "S3" relative to the waypoints P1 and P2 where the distance between the target wafer hold thereon and an above supporter is "S1". The store module stores the above positions of the waypoints P1-P5, the parameters S1, S2 and S3, as well as other offline teaching data including the thickness "d" of the target wafer, the vertical interval "S" between the supporters, and the thickness "t" of the supporter. The offline teaching data stored in the store module teaches the robot to perform the pick-up operation as follows: firstly, the robot moves horizontally from the initial position of the waypoint P1 to the waypoint P2, then moves vertically upward to the waypoint P3 and picks up the target wafer, the robot continues to move upward with the target wafer to the waypoint P4, and finally moves horizontally from the waypoint P4 the end position of the waypoint P5. Preferably, the stored offline teaching data also teaches the robot to clamp the target wafer with its gripper at the waypoint P5' when the robot moves horizontally from the waypoint P4 towards the waypoint P5.

Figure 5B:
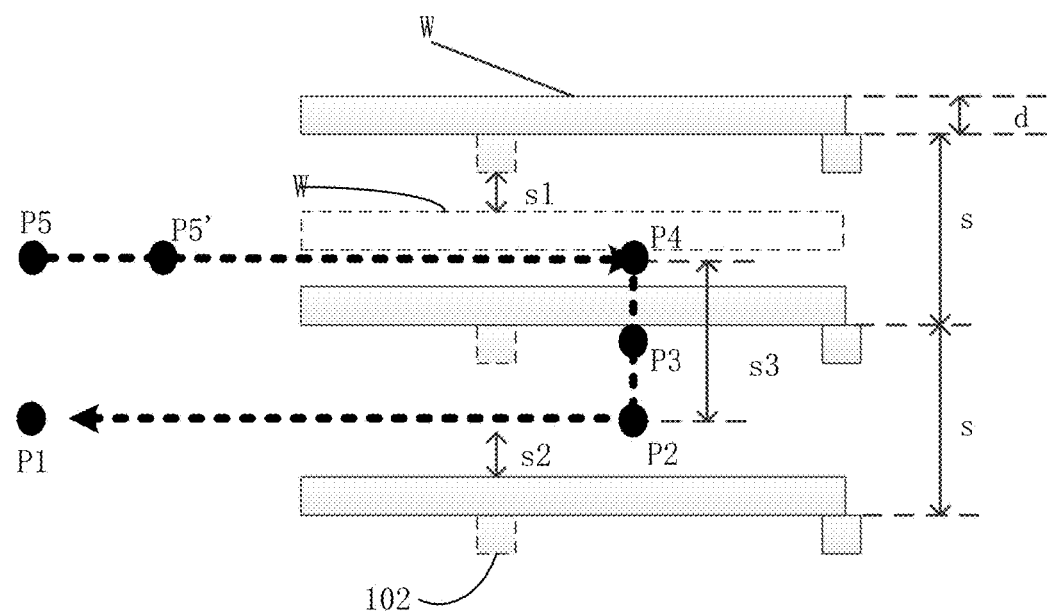
FIG. 5b is a view illustrating a wafer place path and the position relationship between the wafer, the supporters and the fork according to the first embodiment of the present invention.

FIG. 5b is a view illustrating the positional relation between the target wafer, the supporter and the fork during the place operation. According to the embodiment, the robot performs the wafer place operation along a place operation path as represented by the thick dotted line of FIG. 5b passing through five waypoints P5-P1 successively. The place operation path is opposite to the pick-and-place path. Herein, the waypoint P5 represents a first position at which the robot carrying the target wafer is ready to enter into the wafer carrier, the waypoint P4 represents a second position right above a target position for accommodating the target wafer at which the robot is ready to place the target wafer. The distance between the waypoint P5 and the wafer carrier is preferably to be greater than twice the vertical interval "S" between the supporters. The waypoints P4 and P5 are in the same level at a height that the distance between the target wafer and an adjacent above supporter is "S1". The waypoint P3 represents a third position at which the robot places the target wafer on the supporters, the waypoint P2 represents a fourth position right below the third position P3 at which the robot is ready to leave the wafer carrier, the waypoint P1 represents a fifth position outside the wafer carrier at which the robot finishes the place operation. The waypoints P2 and P1 are in the same level at a height of "S2" relative to the plane of a wafer below the fork with a vertical distance of "S3" to the waypoints P5 and P4. The distance between the waypoint P1 and the wafer carrier is preferably to be greater than twice the vertical interval "S" between the supporters. The store module stores the above waypoints P5-P1, the parameters S1-S3 for the wafer place operation, as well as other offline teaching data including the thickness "d" of the target wafer, the vertical interval "S" between the supporters, and the thickness "t" of the supporter. Accordingly, the offline teaching data stored in the store module teaches the robot to perform the place operation as follows: firstly, the robot moves horizontally from the initial position of the waypoint P5 to the waypoint P4, then moves vertically downward to the waypoint P3 and places the target wafer on the supporters, the robot continues to move downward without the target wafer to the waypoint P2, and finally moves horizontally from the waypoint P2 to the end position of the waypoint P1. It is noted that, although in the embodiment, the positions of the waypoints P1 to P5 and the parameters of S1-S3 for the pick-up path and those for the place path are the same, they can also be different and respectively stored in the store module.

As shown in FIG. 3 and FIG. 4, the three upper sensors S1, S2, S3 (indicated by black spots) of the first sensor group are arranged on the top surface of the fork 101 of the robot 100 for detecting distances between the fork 101 and the target wafer when the upper sensors are below the target wafer before the robot picking up the target wafer from the supporter and after the robot placing the wafer on the supporter. The sensors S1 and S2 are respectively arranged on the two symmetrical wings of the V-shaped fork 101 and on a symmetric line of the wafer W which is vertical to the symmetrical axis of the fork 101; the sensor S3 is arranged on a vertex of the V-shaped fork 101. Using right hand rule, a reference frame is defined based on the plane of the top surface of the fork 101. Therefore, the plane of the top surface of the fork 101 is set as a XOY reference plane, a connection line between the sensors S1 and S2 is set as an X axis, a line through the sensor S3 and perpendicular to the connection line is set as a Y axis, the midpoint of the connection line is set as a zero point of the XOY reference plane. In the embodiment, the upper sensors S1-S3 are optical sensors which emit lights in parallel. Wherein, the lights emitted by the optical sensors S1-S3 are vertical to the plane of the fork.

When the robot moves between the waypoints P1 and P2 before picking up the target wafer during the pick-up operation or after placing the target wafer during the place operation, each upper sensor periodically detects a distance to the target wafer in the vertical direction. Then in the reference frame, spatial coordinates of three points on the target wafer surface whose projections on the XOY reference plane are the sensors S1-S3 can be obtained as $(x_1, y_1, z_1)$, $(x_2, y_2, z_2)$ and $(x_3, y_3, z_3)$. Wherein, $x_1$, $x_2$ and $x_3$ are X coordinates of the sensors S1-S3; $y_1$, $y_2$ and $y_3$ are Y coordinates of the sensors S1-S3; $z_1$, $z_2$ and $z_3$ are the vertical distances detected by the sensors S1-S3.

The calculate module calculates the tilted angle of the target wafer according to the spatial coordinates of the three points on the target wafer surface. Specifically, based on these spatial coordinates $(x_1, y_1, z_1)$, $(x_2, y_2, z_2)$ and $(x_3, y_3, z_3)$, an equation of the target wafer plane is acquired as: $aX+bY+cZ+d=0$; wherein, the terms a, b, c and d are calculated as follows:

$$a = y_1 z_2 - y_1 z_3 - y_2 z_1 + y_2 z_3 + y_3 z_1 - y_3 z_2;$$

$$b = -x_1 z_2 \pm x_1 z_3 \pm x_2 z_1 - x_2 z_3 - x_3 z_1 + x_3 z_2;$$

$$c = x_1 y_2 - x_1 y_3 - x_2 y_1 + x_2 y_3 + x_3 y_1 - x_3 y_2;$$

$$d = -x_1 y_2 z_3 + x_1 y_3 z_2 + x_2 y_1 z_3 - x_2 y_3 z_1 - x_3 y_1 z_2 \pm x_3 y_2 z1.$$

Then, the angle α between the plane of the target wafer and the XOY reference plane, which is the tilted angle of the target wafer relative to the fork, meets the following equation:

$$\cos \alpha = c/[\sqrt{(a^2+b^2+c^2)}]$$

$$\alpha = \arccos(c/[\sqrt{(a^2+b^2+c^2)}]).$$

The determine module determines whether each distance is within a preset range and whether the tilted angle is less than or equal to a limit angle.

Specifically, when the robot moves between the waypoints P1 and P2, there is a margin γ in the height of the bottom surface of the fork. That is, the minimum height $H_{min}$ of the fork is S2-γ, and the maximum height $H_{max}$ of the fork is S2+γ. Accordingly, the distance Zi detected by each upper sensor of the first sensor group should be within the range of S-d-S2-γ<Zi<S-d-S2+γ. The determine module compares the minimum distance among the three distances detected by the upper sensors S1-S3 with a first limit value of S-d-S2-γ, and compares the maximum distance among the three distances detected by the upper sensors S1-S3 with a second limit value of S-d-S2+γ to determine whether the distances detected by the first sensor group exceed the preset range.

On the other hand, in the case where the target wafer is tilted, the static friction force must counteract the component of the gravity force that acts along the interface between the target surface and the supporters. Taking the limiting case that the target wafer is inclined by a limit angle δ that the component of the force of gravity is equal to the maximum value of the force of static friction, just before the target wafer begins to slide, the limit angle δ satisfies the relationship of:

$$mg\sin(\delta) - \mu mg \cos(\delta) = 0$$

Therefore, the tangent of the limit angle δ is equal to the coefficient μ of the static friction:

$$\delta = \arctan(\mu).$$

Figure 8:
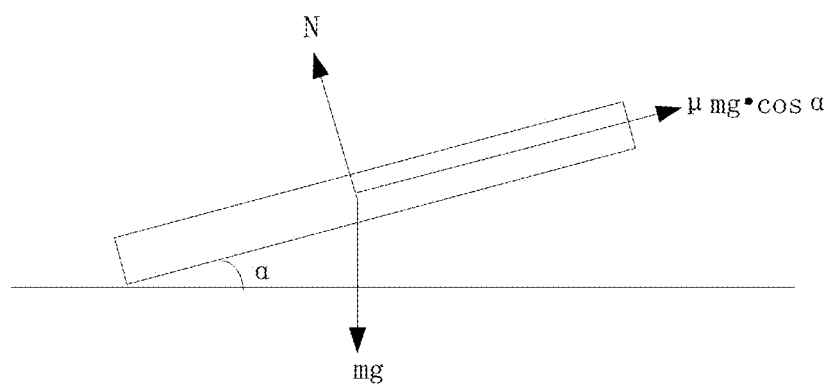
FIG. 8 is a free-body diagram of the inclined wafer according to the first embodiment of the present invention

Accordingly, as shown in FIG. 8, the tilted angle α of the target wafer should be smaller than the limit angle δ, which can be represented as $\alpha \leq \arctan(\mu)$.

The determine module compares the tilted angle calculated by the calculate module with the limit angle and determines whether the target wafer will slide off the supporters.

When the determine module determines that either at least one distance detected by the upper sensors of the first group exceeds the preset range or the tilted angle α of the target wafer exceeds the limit angle, the control module stops the motion of the robot. Optionally, the control module also sends a signal to the alert module to issue an alert.

Furthermore, during the pick-up operation, in the case where the target wafer is tilted, the lowest end of the target wafer may collide with the robot when the robot enters into the wafer carrier, while the highest end of the target wafer may be higher than the waypoint P4, which causes failure of the pick-up operation. Therefore, in another preferred embodiment, the calculate module calculates the minimum distance between the target wafer and the fork as well as the maximum distance between the target wafer and the fork according to the vertical distances detected by the sensors S1-S3 when the robot moves from the waypoint P1 to the waypoint P2. Specifically, as mentioned above, the equation of the target wafer plane is acquired as aX+bY+cZ+d=0, thus the distance Z between any point on the target wafer and the fork satisfies the following relationship:

$$Z = (-d - aX - bY)/c, \left(\frac{X}{R\cos\alpha}\right)^2 + \left(\frac{Y}{R}\right)^2 = 1$$

wherein R is the radius of the target wafer.

The calculate modules solves the equation by a differential method to obtain the minimum distance Zmin and maximum distance Zmax.

Then the determine module compares the minimum distance Zmin with the first limit value of S-d-S2-γ, if Zmin<S-d-S2-γ, the control module stops the robot and optionally send a signal to the alert module to issue an alert. The determine module also compares the maximum value Zmax with the offline teaching data S3, if Zmax>S3, which means that the robot cannot touch the target wafer during the pick-up operation, the control module stops the robot and optionally send a signal to the alert module to issue an alert.

It is noted that, in order to ensure a safe pick-up operation, when the robot arrives at the waypoint P2 before picking up the target wafer, each sensor detects a latest distance to the target wafer. The calculate module calculates the latest tilted angle of the target wafer, the minimum distance and maximum distance between the target wafer and the fork. The determine determines whether the robot can pick up the target wafer safely according to the above calculated data.

Furthermore, when the robot moves to the waypoint P4, the determine module determines whether the target wafer is positioned on the fork according to the feedback signal from the upper sensors of the first sensor group on the top surface of the fork. If the upper sensors detect distances, which means that the upper sensors are not covered by the target wafer, the control module stops the robot and optionally sends a signal to the alert module to issue an alert.

From above, when the robot horizontally moves between the waypoints P1 and P2 before the robot picking up the target wafer and after the robot placing the target wafer, the distance between the fork of the robot and the target wafer is detected to determine whether the robot will collide with the target wafer. Furthermore, the tilted angle of the target wafer relative to the fork is also calculated to determine whether the wafer will slip off. If collision or wafer slippery may occur, the robot is controlled to stop the operation. Therefore, wafer damages due to unexpected contact between the fork and the wafer can be avoided.

Table 1 illustrated the relationship between the distance detected by the upper sensors and the state of the target wafer during the pick-up and place operation.

TABLE 1

| | Waypoint(s) | Return value (D1 is a vertical distance between the upper sensors and the target wafer; D2 is a horizontal distance between the waypoints P1(P5) and P2(P4)) | State of the target wafer |
|---|---|---|---|
| the wafer pick-up and place operation | P1 | D2 > 2s | |
| | P1 -> P2 | D1 < s-d-s2 + γ and D1 > s-d-s2 - γ | normal |
| | | D1 > s-d-s2 - γ | abnormal |
| | | D1 > s-d-s2 + γ | abnormal |
| | P5 | D2 > 2s | |

However, if an underlying wafer below the robot tilts, collision with the fork or wafer slippery may occur to the underlying wafer, which also brings the pick-and-place operation in an unsafe condition. To overcome the above deficiencies, the fork is provided with a second sensor group of at least three non-linear arranged lower sensors on its bottom surface to detect distances between the fork 101 and the underlying wafer when the robot moves horizontally below the target wafer.

In the embodiment, three lower sensors S1', S2', S3' are provided on the bottom surface of the fork at positions corresponding to the upper sensors S1-S3. Using left hand rule, another reference frame is defined based on the plane of the bottom surface of the fork 101. Therefore, the plane of the bottom surface of the fork 101 is set as a X'OY' reference plane, a connection line between the sensors S1' and S2' is set as an X axis, while a line through the sensor S3' and perpendicular to the connection line is set as a Y axis. Accordingly, the midpoint of the connection line is the zero point of the X' OY' reference plane. In the embodiment, the lower sensors S1'-S3' are optical sensors which emit lights vertical to the fork plane in parallel. When the robot moves between the waypoints P1 and P2 before picking up the target wafer during the pick-up operation or after placing the target wafer during the place operation, each sensor periodically detects a distance to the underlying wafer in the vertical direction. Then in the reference frame, spatial coordinates of three points on the underlying wafer surface whose projections on the XOY reference plane are the lower sensors S1'-S3' can be obtained as $(x_1', y_1', z_1')$, $(x_2', y_2', z_2')$ and $(x_3', y_3', z_3')$. Wherein, $x_1'$, $x_2'$ and $x_3'$ are X coordinates of the sensors S1'-S3'; $y_1'$, $y_2'$ and $y_3'$ are Y coordinates of the sensors S1'-S3'; $z_1'$, $z_2'$ and $z_3'$ are distances detected by the sensors S1'-S3'.

The calculate module calculates the tilted angle of the underlying wafer according to the spatial coordinates of the three points on the underlying wafer surface. Specifically, based on these spatial coordinates $(x_1', y_1', z_1')$, $(x_2', y_2', z_2')$ and $(x_3', y_3', z_3')$, an equation of the underlying wafer plane is acquired as $a'X+b'Y+c'Z+d'=0$; wherein, the terms a', b', c' and d' are calculated as follows:

$$a'=y_1'z_2'-y_1'z_3'-y_2'z_1'+y_2'z_3'+y_3'z_1'-y_3'z_2'$$

$$b'=-x_1'z_2'\pm x_1'z_3'+x_2'z_1'-x_2'z_3'-x_3'z_1'+x_3'z_2'$$

$$c'=x_1'y_2'-x_1'y_3'-x_2'y_1'+x_2'y_3'+x_3'y_1'-x_3'y_2',$$

$$d'=-x_1'y_2'z_3'+x_1'y_3'z_2'+x_2'y_1'z_3'-x_2'y_3'z_1'-x_3'y_1'z_2'+x_3'y_2'z_1'.$$

Then, the angle α' between the plane of the underlying wafer and the X'OY' reference plane, which is the tilted angle of the underlying wafer relative to the fork, meets the following equation:

$$\cos\alpha'=c'/[\sqrt{a'^2+b'^2+c'^2}]$$

$$\alpha'=\arccos(c'/[\sqrt{a'^2+b'^2+c'^2}]).$$

The determine module compares the minimum distance among the three distances detected by the sensors S1'-S3' with a minimum height of the fork which is S2-γ to determine whether the fork moves lower than the minimum height $H_{min}$.

On the other hand, the determine module also compares the tilted angle α' calculated by the calculate module with the limit angle and determines whether the underlying wafer will slide off the supporters.

When the determine module determines either at least one distance detected by the lower sensors of the second group is less than the minimum height or the tilted angle of the underlying wafer exceeds the limit angle, the control module stops the motion of the robot. Optionally, the control module also sends a signal to the alert module to issue an alert.

Figure 6A:
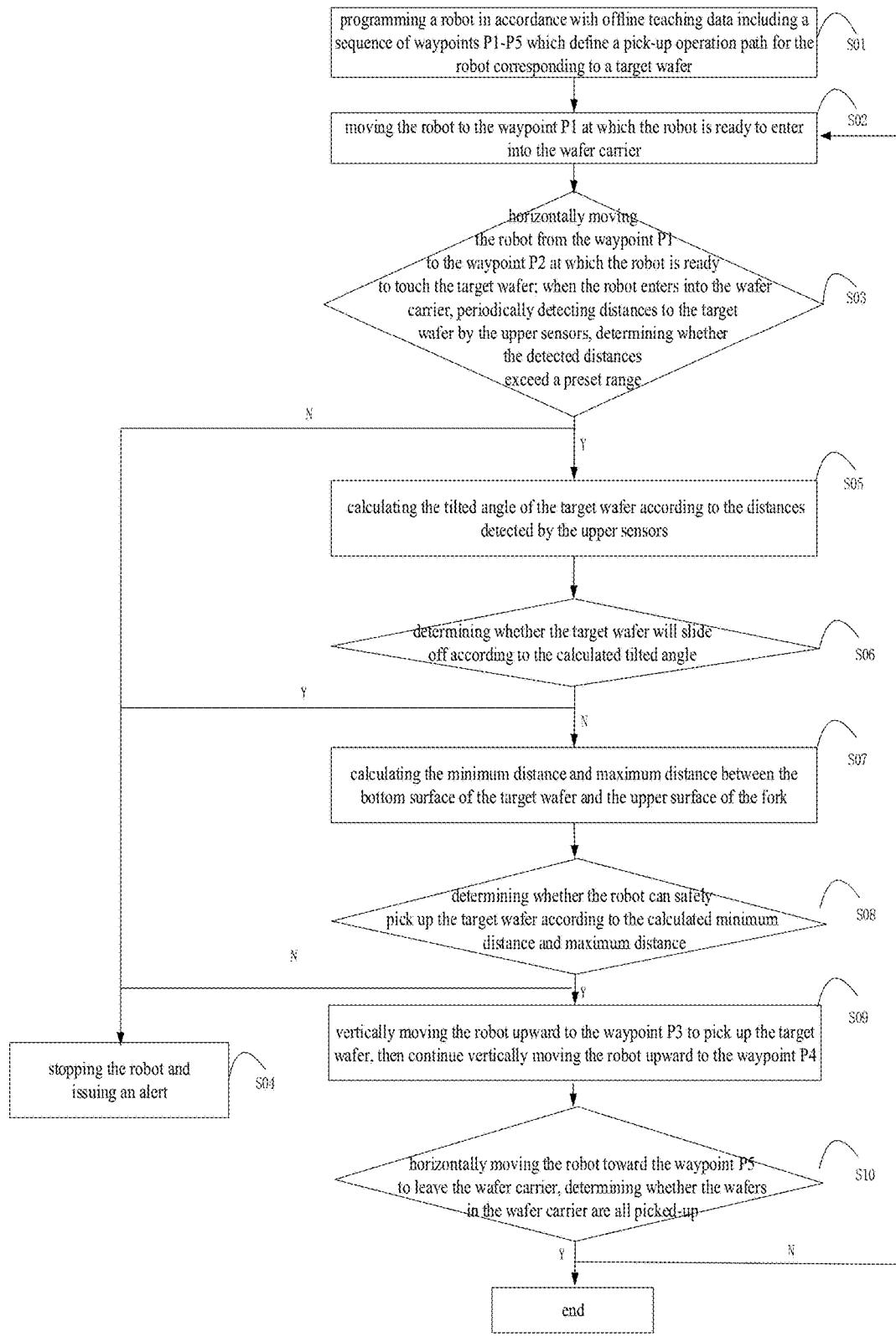
FIG. 6a is a flow chart illustrating the wafer pick-up method according to the first embodiment of the present invention.

Now please referring to FIG. 6a, which is a wafer pick-up method according to the embodiment, the pick-up method comprises the following steps:

Step 01: programming a robot in accordance with offline teaching data including a sequence of waypoints P1-P5 which define a pick-up operation path for the robot corresponding to a target wafer.

Wherein, the robot has a fork and a first sensor group of at least three non-linear upper sensors fixed on a top surface of the fork.

Step 02: moving the robot to the waypoint P1 at which the robot is ready to enter into the wafer carrier.

Step 03: horizontally moving the robot from the waypoint P1 to the waypoint P2 at which the robot is ready to touch the target wafer; when the robot enters into the wafer carrier, periodically detecting distances to the target wafer by the upper sensors, determining whether the detected distances exceed a preset range. If yes, goes to Step 04; if no, continues to Step 05;

Preferably, the robot further has a second sensor group of at least three non-linear arranged lower sensors fixed on a bottom surface of the fork. The Step 03 further comprises: periodically detecting distances to an underlying wafer below the target wafer by the lower sensors when the robot enters into the wafer carrier, determining whether at least one detected distance is less than a minimum limit height. If yes, goes to Step 04; if no, continues to Step 05;

Step 04: stopping the robot and issuing an alert;

Step 05: calculating the tilted angle of the target wafer according to the distances detected by the upper sensors;

Step 06: determining whether the target wafer will slide off according to the calculated tilted angle; if yes, goes to Step 03; if no, continues to Step 07;

Step 07: calculating the minimum distance and maximum distance between the bottom surface of the target wafer and the upper surface of the fork;

Step 08: determining whether the robot can safely pick up the target wafer without colliding with the target wafer according to the calculated minimum distance and maximum distance; if no, goes to Step 03; if yes, goes to Step 09;

Step 09: vertically moving the robot upward to the waypoint P3 to pick up the target wafer, then continue vertically moving the robot upward to the waypoint P4;

Step 10: horizontally moving the robot toward the waypoint P5 to leave the wafer carrier, determining whether the wafers in the wafer carrier are all picked-up; if no, goes to Step 02 to perform the pick-up operation for another target wafer; if yes, goes to end.

Figure 6B:
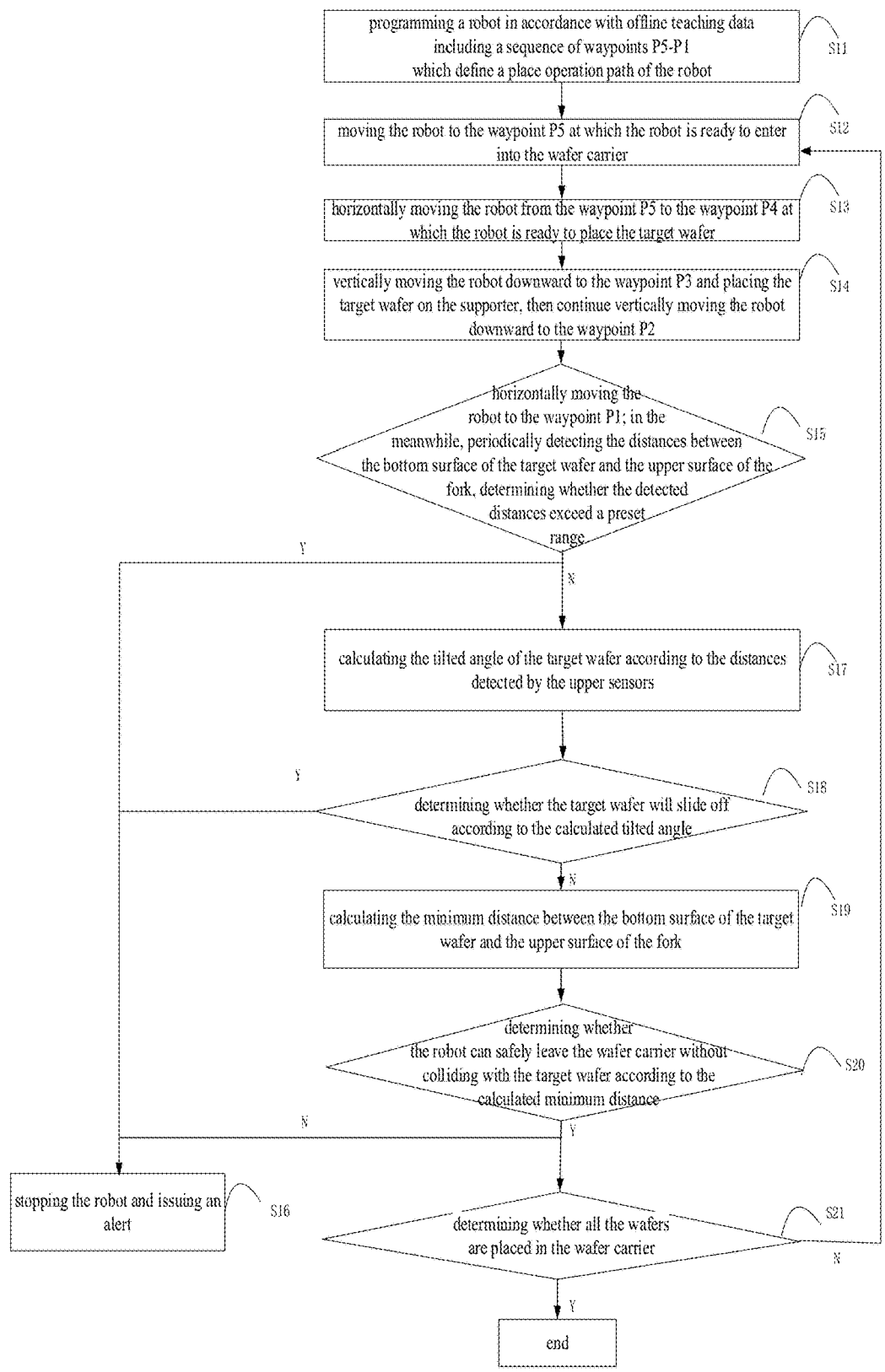
FIG. 6b is a flow chart illustrating the wafer placing method according to the first embodiment of the present invention.
Figure 7A:
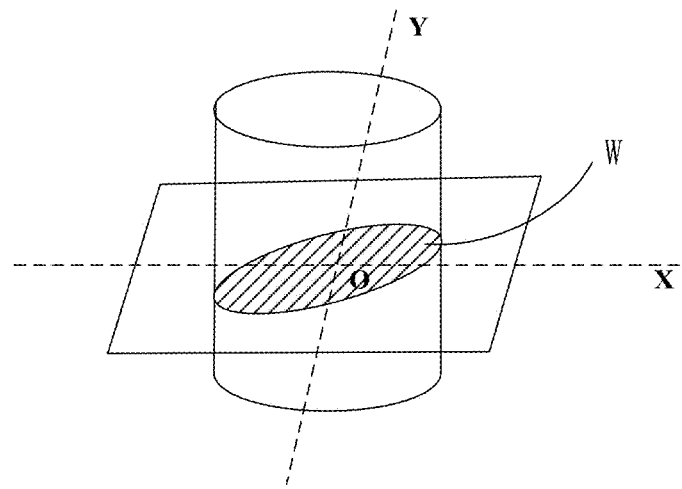
FIG. 7a is a view illustrating the position relationship between the plane of the fork and the plane of an inclined wafer according to the first embodiment of the present invention.
Figure 7B:
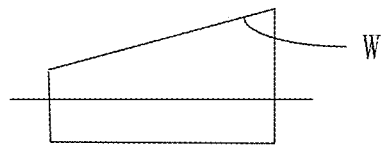
FIG. 7b is a section view illustrating the position relationship between the plane of the fork and the plane of an inclined wafer according to the first embodiment of the present invention.

Please referring to FIG. 6b, which is a wafer place method according to the embodiment, the place method comprises the following steps:

Step 11: programming a robot in accordance with offline teaching data including a sequence of waypoints P5-P1 which define a place operation path of the robot. Wherein, the robot has a fork and a first sensor group of at least three non-linear upper sensors fixed on a top surface of the fork;

Step 12: moving the robot to the waypoint P5 at which the robot is ready to enter into the wafer carrier;

Step 13: horizontally moving the robot from the waypoint P5 to the waypoint P4 at which the robot is ready to place the target wafer;

Step 14: vertically moving the robot downward to the waypoint P3 and placing the target wafer on the supporter, then continue vertically moving the robot downward to the waypoint P2;

Step 15: horizontally moving the robot to the waypoint P1; in the meanwhile, periodically detecting the distances between the bottom surface of the target wafer and the upper surface of the fork, determining whether the detected distances exceed a preset range. If yes, goes to Step 16; if no, continues to Step 17;

Preferably, the robot further has a second sensor group of at least three non-linear arranged lower sensors fixed on a bottom surface of the fork. The Step 15 further comprises: periodically detecting distances to an underlying wafer below the target wafer by the lower sensors, determining whether at least one detected distance is less than a minimum limit height. If yes, goes to Step 16; if no, continues to Step 17;

Step 16: stopping the robot and issuing an alert;

Step 17: calculating the tilted angle of the target wafer according to the distances detected by the upper sensors;

Step 18: determining whether the target wafer will slide off according to the calculated tilted angle; if yes, goes to Step 16; if no, continues to Step 19;

Step 19: calculating the minimum distance between the bottom surface of the target wafer and the upper surface of the fork;

Step 20: determining whether the robot can safely leave the wafer carrier without colliding with the target wafer according to the calculated minimum distance; if no, goes to Step 16; if yes, goes to Step 21;

Step 21: determining whether all the wafers are placed in the wafer carrier; if no, goes to Step 12 to perform the place operation for another target wafer; if yes, goes to end.

Preferably, after each pick-and-place operation, the tilted angle of the target wafer is stored in the store module. These stored tilted angles can be recorded to form a curve which reflects the deformation state or deformation tendency of the supporters. Specifically, according to the tilted angles of all the wafers in the wafer carrier, the deformation of the wafer carrier can be obtained. On the other hand, according to the tilted angles of different wafers to be picked or placed at a same target position in the wafer carrier, the deformation tendency of the supporters at the target position can be obtained. As a result, the maintenance cycle of the wafer carrier can be accurately designed accordingly.

Second Embodiment

Compared with the first embodiment, the robot further has at least one image sensor on the top surface of the fork for detecting the position of the target wafer before the robot picking up the target wafer. Other features of the wafer pick-and-place system and method are the same with those described in the first embodiment, which is omitted herein.

Figure 9:
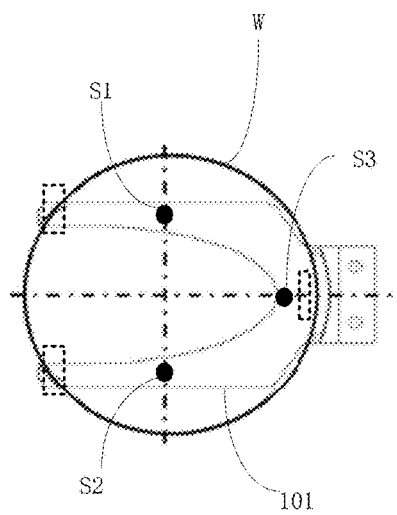
FIG. 9 is a view illustrating the position relationship between the fork of the robot and the target wafer according to a second embodiment of the present invention
Figure 10:
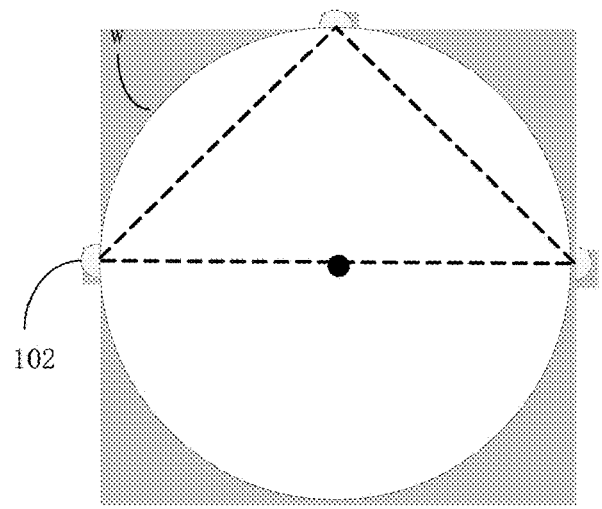
FIG. 10 is a top view illustrating the position relationship between the fork, the supporters and the target wafer according to the second embodiment of the present invention
Figure 10:
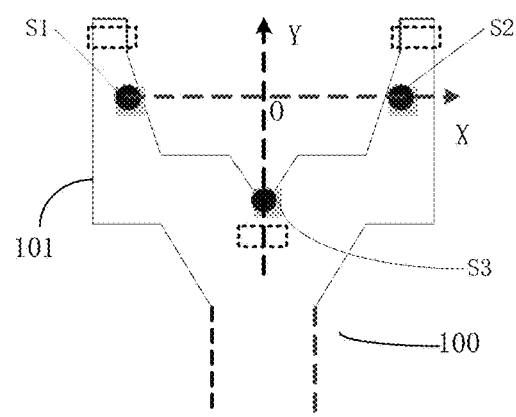

Please referring to FIG. 9 and FIG. 10, the three upper sensors S1, S2, S3 (indicated by black spots) of the first sensor group are arranged on the top surface of the fork 101 for distance detection. Wherein the sensors S1 and S2 are respectively arranged on the two symmetrical wings of the V-shaped fork 101 and on the symmetric line of the wafer W which is vertical to the symmetrical axis of the fork 101; the sensor S3 is arranged on a vertex of the V-shaped fork 101.

At least one image sensor is arranged on the top surface of the fork to capture the image of the target wafer. In the embodiment, the image sensor can be disposed at the end of either wing of the fork or the vertex of the fork (indicated by dotted box). When the robot moves to the waypoint P2, the image sensor captures the image of the target wafer. The calculate module calculates the coordinate of the target wafer center according to the image of the target wafer. Specifically, the calculate module calculates the coordinates of three arbitrary points $(X_1, Y_1)$, $(X_2, Y_2)$, $(X_3, Y_3)$ at the periphery edge of the target wafer in the XOY reference plane. Then the coordinate of the target wafer center $(X_c, Y_c)$ can be calculated by solving the equations of:

$$(X_1-X_c)^2+(Y_1-Y_c)^2=R^2;$$

$$(X_2-X_c)^2+(Y_2-Y_c)^2=R^2;$$

$$(X_3-X_c)^2+(Y_3-Y_c)^2=R^2.$$ Wherein, $R$ is the radius of the target wafer.

Figure 11:
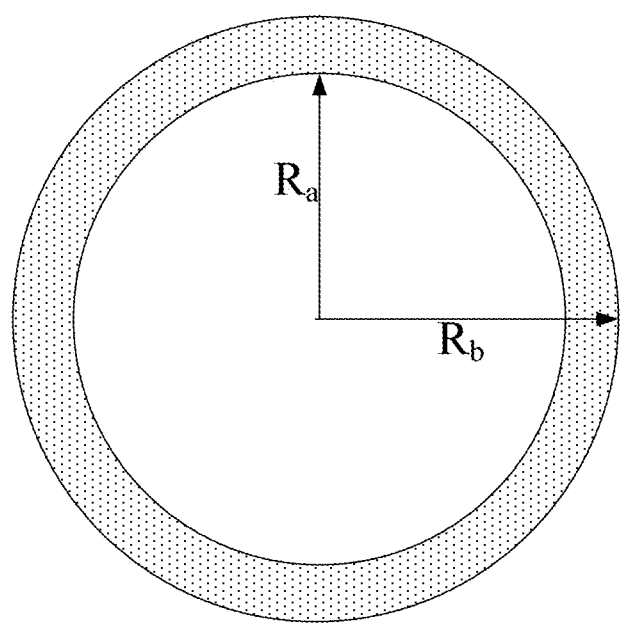
FIG. 11 is a view illustrating the allowance offset of the target wafer center according to the second embodiment of the present invention

The calculate module further calculates an offset $D_{offset}$ between the target wafer center and the zero point of the XOY reference plane according to the equation of: $D_{offset}=\sqrt{(X_c^2+Y_c^2)}$. As shown in FIG. 11, the allowance offset of the target wafer center is $R_b-R_a$, then the determine module compares the offset $D_{offset}$ with the allowance offset $R_b-R_a$, if $D_{offset}>R_b-R_a$, the control module moves the robot to align with the target wafer.

In another embodiment, the robot further has at least one image sensor on the bottom surface of the fork for detecting the position of the supporters before the robot placing the target wafer on the supporters.

In the embodiment, the image sensor is arranged on the bottom surface of the fork to capture the image of the supporters on which the target wafer is to be placed. When the robot moves to the waypoint P4, the image sensor captures the image of the supporters. The calculate module calculates the coordinate of the center of the supporters according to the image of the supporters. Specifically, the calculate module calculates the coordinates of three points $(X_1', Y_1')$, $(X_2', Y_2')$, $(X_3', Y_3')$ respectively at the same position on the three supporters (e.g. the outmost points of the supporters) in the XOY reference plane. Then the coordinate of the center of the supporters $(X_c', Y_c')$ can be calculated by solving the equations of:

$$(X_1'-Y_c')^2+(X_1'-Y_c')^2=(X_2'-Y_c')^2+(X_2'-Y_c')^2=(X_3'-Y_c')^2+(X_3'-Y_c')^2.$$

The calculate module further calculates the offset $D_{offset}'$ between the center of the supporters and the zero point of the XOY reference plane according to the equation of: $D_{offset}'=\sqrt{X_c'^2+Y_c'^2}$. Assuming that the allowance offset of the center of the supporters is $R_s$, then the determine module compares the offset $D_{offset}'$ with the allowance offset $R_s$, if $D_{offset}'>R_s$, the control module adjusts the position of the robot correspondingly to make the center of the fork align with the center of the supporters.

While the invention has been particularly shown and described with references to preferred embodiments thereof, if will be understood by those skilled in the art that various changes in form and details may be made herein without departing from the spirit and scope of the invention as defined by the appended claims.

The invention claimed is:

1. A wafer pick-and-place method for picking and placing a target wafer in a wafer carrier comprising:
   Step S1: providing a robot having a fork, wherein the fork has a first sensor group of at least three non-linear arranged upper sensors fixed on its top surface;
   Step S2: actuating the robot in accordance with offline teaching data including a sequence of waypoints which define a pick-up operation path or a place operation path for the robot corresponding to the target wafer;
   Step S3: periodically detecting distances between the fork and the target wafer by the upper sensors when the robot moves below the target wafer and calculating a tilted angle of the target wafer according to the distances detected by the upper sensors each time;

Step S4: determining whether at least one distance detected by the upper sensors exceeds a preset range of a first limit value to a second limit value and whether the tilted angle exceeds a limit angle;

if either the distance exceeds the preset range or the tilted angle exceeds the limit angle, stopping the robot.

2. The wafer pick-and-place method according to claim 1, wherein the pick-up operation path is defined by five waypoints in a sequence of a first waypoint outside the wafer carrier, a second waypoint right below the target wafer at a same height with the first waypoint, a third waypoint right above the second waypoint at which the fork picks up or places the target wafer, a fourth waypoint right above the third waypoint, and a fifth waypoint outside the wafer carrier at a same height with the fourth waypoint; the place operation path is defined by the five waypoints in a sequence of the fifth waypoint, the fourth waypoint, the third waypoint, the second waypoint and the first waypoint.

3. The wafer pick-and-place method according to claim 2, wherein the tilted angle of the target wafer is calculated by the following steps:

obtaining spatial coordinates of three points on the bottom surface of the target wafer whose projections on the upper surface of the fork are the upper sensors according to the distances detected by the upper sensors and plane coordinates of the upper sensors;

establishing a plane equation of the target wafer according to the spatial coordinates;

calculating an angle between the plane of the target wafer and the plane of the fork.

4. The wafer pick-and-place method according to claim 3, wherein, the Step S3 further comprises calculating a maximum distance and a minimum distance between the target wafer and the fork according to the tilted angle of the target wafer;

the Step S4 further comprises determining whether the minimum distance is less than the first limit value and whether the maximum distance is greater than a distance between the second waypoint and the fourth waypoint; if either the minimum distance is less than the first limit value or the maximum distance exceeds the distance between the second waypoint and the fourth waypoint, stopping the robot.

5. The wafer pick-and-place method according to claim 4, wherein the robot further has a second sensor group of at least three non-linear arranged lower sensors fixed on the bottom surface of the fork;

the Step S3 further comprises periodically detecting distances between the fork and an underlying wafer by the lower sensors when the robot moves below the target wafer;

the Step S4 further comprises determining whether at least one distance detected by the lower sensors is less than a third limit value; if yes, stopping the robot.

6. The wafer pick-and-place method according to claim 5, wherein, the Step S3 further comprises calculating a tilted angle of the underlying wafer according to the distances detected by the lower sensors each time;

Step S4: determining whether the tilted angle of the underlying wafer exceeds the limit angle; if yes, stopping the robot.

7. The wafer pick-and-place method according to claim 6, wherein the tilted angle of the underlying wafer is calculated by the following steps:

obtaining spatial coordinates of three points on the top surface of the underlying wafer whose projections on the bottom surface of the fork are the lower sensors according to the distances detected by the lower sensors and plane coordinates of the lower sensors;

establishing a plane equation of the underlying wafer according to the spatial coordinates;

calculating an angle between the plane of the underlying wafer and the plane of the fork.

8. The wafer pick-and-place method according to claim 1, the robot further has at least one upper image sensor on the top surface of the fork; the method further comprising:

capturing an image of the target wafer by the upper image sensor when the robot is right below the target wafer before picking up the target wafer and recognizing a position of the target wafer center;

calculating an offset between the target wafer center and the fork center;

determining whether the offset exceeds a limit offset value; if yes, moving the robot to be aligned with the target wafer.

9. The wafer pick-and-place method according to claim 1, the robot further has at least one lower image sensor on the bottom surface of the fork; the method further comprising:

capturing an image of the supporters on which the target wafer is to be placed by the lower image sensor when the robot is right above the supporters before placing the target wafer and recognizing a position of the center of the supporters;

calculating an offset between the center of the supporters and the fork center;

determining whether the offset exceeds a limit offset value; if yes, moving the robot to be aligned with the center of the supporters.

10. The wafer pick-and-place method according to claim 1, further comprising:

after each pick-up operation or place operation, storing the tilted angle of each target wafer.

11. A wafer pick-and-place system for picking and placing a target wafer in a wafer carrier comprising:

a robot having a fork and a first sensor group of at least three non-linear arranged upper sensors fixed on a top surface of the fork; wherein the upper sensors periodically detects distances between the fork and the target wafer when the robot moves below the target wafer;

a store module storing offline teaching data which includes a sequence of waypoints defining a pick-up operation path or a place operation path for the robot corresponding to the target wafer;

a calculate module calculating a tilted angle of the target wafer according to the distances detected by the upper sensors each time;

a determine module determining whether at least one distance detected by the upper sensors exceeds a preset range of a first limit value to a second limit value and whether the tilted angle exceeds a limit angle; and a control module stopping the robot if either the distance exceeds the preset range or the tilted angle exceeds the limit angle.

12. The wafer pick-and-place system according to claim 11, wherein the pick-up operation path is defined by five waypoints in a sequence of a first waypoint outside the wafer carrier, a second waypoint right below the target wafer at a same height with the first waypoint, a third waypoint right above the second waypoint at which the fork picks up or places the target wafer, a fourth waypoint right above the third waypoint, and a fifth waypoint outside the wafer carrier at a same height with the fourth waypoint; the place operation path is defined by the five waypoints in a sequence of the fifth waypoint, the fourth waypoint, the third waypoint, the second waypoint and the first waypoint.

13. The wafer pick-and-place system according to claim 12, wherein the calculate module calculates the tilted angle of the target wafer by the following steps:
   obtaining spatial coordinates of three points on the bottom surface of the target wafer whose projections on the upper surface of the fork are the upper sensors according to the distances detected by the upper sensors and plane coordinates of the upper sensors;
   establishing a plane equation of the target wafer according to the spatial coordinates;
   calculating an angle between the plane of the target wafer and the plane of the fork.

14. The wafer pick-and-place system according to claim 13, wherein calculate module calculates a maximum distance and a minimum distance between the target wafer and the fork according to the tilted angle of the target wafer; the determine module determines whether the minimum distance is less than the first limit value and whether the maximum distance is greater than a distance between the second waypoint and the fourth waypoint; if either the minimum distance is less than the first limit value or the maximum distance exceeds the distance between the second waypoint and the fourth waypoint, the control module stops the robot.

15. The wafer pick-and-place system according to claim 1, wherein the robot further has a second sensor group of at least three non-linear arranged lower sensors fixed on the bottom surface of the robot; the lower sensors periodically detects distances between the fork and an underlying wafer when the robot moves below the target wafer; the determine module determines whether at least one distance detected by the lower sensors is less than a third limit value; if yes, the control module stops the robot.

16. The wafer pick-and-place system according to claim 14, wherein the calculate module calculates a tilted angle of the underlying wafer according to the distances detected by the lower sensors each time; the determine module determines whether the tilted angle of the underlying wafer exceeds the limit angle; if yes, the control module stops the robot.

17. The wafer pick-and-place system according to claim 16, wherein the calculate module calculates the tilted angle of the underlying wafer by the following steps:
   obtaining spatial coordinates of three points on the upper surface of the underlying wafer whose projections on the bottom surface of the fork are the lower sensors according to the distances detected by the lower sensors and plane coordinates of the lower sensors;
   establishing a plane equation of the underlying wafer according to the spatial coordinates;
   calculating an angle between the plane of the underlying wafer and the plane of the fork.

18. The wafer pick-and-place system according to claim 11, wherein the robot further has at least one upper image sensor on the top surface of the fork; the upper image sensor captures an image of the target wafer when the robot is right below the target wafer before picking up the target wafer; the calculate module recognizes a position of the target wafer center and calculates an offset between the target wafer center and the fork center; the determine module determines whether the offset exceeds a limit offset value; if yes, the control module moves the robot to be aligned with the target wafer.

19. The wafer pick-and-place system according to claim 11, wherein the robot further has at least one lower image sensor on the bottom surface of the fork; the lower image sensor captures an image of the supporters on which the target wafer is to be placed when the robot is right above the supporters before placing the target wafer; the calculate module recognizes a position of the center of the supporters and calculates an offset between the center of the supporters and the fork center; the determine module determines whether the offset exceeds a limit offset value; if yes, the control module moves the robot to be aligned with the center of the supporters.

20. The wafer pick-and-place system according to claim 11, wherein the store module stores the tilted angle of each target wafer after each pick-up operation or place operation.

* * * * *